United States Patent
Zhang et al.

(10) Patent No.: US 11,329,167 B2
(45) Date of Patent: May 10, 2022

(54) FISHBONE LONG CHANNEL NANOSHEET DEVICE

(71) Applicant: INTERNATIONAL BUSINESS MACHINES CORPORATION, Armonk, NY (US)

(72) Inventors: Jingyun Zhang, Albany, NY (US); Xin Miao, Slingerlands, NY (US); Ruilong Xie, Niskayuna, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 234 days.

(21) Appl. No.: 16/736,898

(22) Filed: Jan. 8, 2020

(65) Prior Publication Data
US 2021/0210637 A1  Jul. 8, 2021

(51) Int. Cl.
*H01L 29/786* (2006.01)
*H01L 29/06* (2006.01)
*H01L 29/423* (2006.01)
*H01L 29/66* (2006.01)
(Continued)

(52) U.S. Cl.
CPC .. *H01L 29/78696* (2013.01); *H01L 21/02532* (2013.01); *H01L 21/02603* (2013.01); *H01L 21/3065* (2013.01); *H01L 29/0673* (2013.01); *H01L 29/42392* (2013.01);
(Continued)

(58) Field of Classification Search
CPC ......... H01L 21/02532; H01L 21/02603; H01L 21/3065; H01L 21/823412; H01L 21/823431; H01L 21/823437; H01L 21/823481; H01L 21/823487; H01L 21/823807; H01L 21/823821; H01L 21/823828; H01L 21/823878; H01L 29/0673; H01L 29/42392; H01L 29/66545; H01L 29/66553; H01L 29/66742; H01L 29/786; H01L 29/78603; H01L 29/78642; H01L 29/78696
See application file for complete search history.

(56) References Cited

U.S. PATENT DOCUMENTS

| | | |
|---|---|---|
| 9,947,743 B2 | 4/2018 | Doris et al. |
| 10,037,885 B2 | 7/2018 | Doris et al. |
| 10,170,549 B2 | 1/2019 | Kittl et al. |

(Continued)

*Primary Examiner* — Cheung Lee
(74) *Attorney, Agent, or Firm* — Tutunjian & Bitetto, PC; Jeffrey S. LaBaw

(57) ABSTRACT

A method is presented for reducing sagging effects in nanosheet devices. The method includes forming at least two nanosheet structures over a substrate, wherein each nanosheet structure includes alternating layers of a first semiconductor material and a second semiconductor material, depositing a dielectric layer over the at least two nanosheet structures, depositing a dummy gate over the dielectric layer, etching the first semiconductor material to create voids filled with inner spacers, removing the dummy gate and the dielectric layer such that a supporting dielectric section remains between the at least two nanosheet structures, and removing the etched first semiconductor material such that a supporting structure is defined including the supporting dielectric section and the second semiconductor material.

20 Claims, 10 Drawing Sheets

(51) Int. Cl.
  *H01L 21/02*      (2006.01)
  *H01L 21/3065*    (2006.01)

(52) U.S. Cl.
  CPC .. *H01L 29/66545* (2013.01); *H01L 29/66553* (2013.01); *H01L 29/66742* (2013.01); *H01L 29/78603* (2013.01)

(56) References Cited

U.S. PATENT DOCUMENTS

| | | | |
|---|---|---|---|
| 10,170,584 B2 | 1/2019 | Guillorn et al. | |
| 10,177,235 B2 | 1/2019 | Balakrishnan et al. | |
| 2017/0345915 A1* | 11/2017 | Coquand | H01L 29/1054 |
| 2017/0365661 A1* | 12/2017 | Doris | H01L 29/66545 |
| 2018/0082902 A1 | 3/2018 | Balakrishnan et al. | |
| 2019/0237360 A1 | 8/2019 | Reznicek et al. | |

* cited by examiner

FISHBONE LONG CHANNEL NANOSHEET DEVICE

BACKGROUND

The present invention relates generally to semiconductor devices, and more specifically, to a fishbone long channel nanosheet device.

Gate-all-around structure field effect transistors (FETs), such as nanosheet devices, can provide better electrostatic control in order to meet the need for further aggressive device scaling. Long channel devices for gate-all-around transistors are beneficial for input/output (I/O) devices. However, a sagging effect caused by surface tension has been observed which can potentially reduce an effective channel area, degrade gate control, and increase threshold voltage variability.

SUMMARY

In accordance with an embodiment, a method is provided for reducing sagging effects in nanosheet devices. The method includes forming at least two nanosheet structures over a substrate, wherein each nanosheet structure includes alternating layers of a first semiconductor material and a second semiconductor material, depositing a dielectric layer over the at least two nanosheet structures, depositing a dummy gate over the dielectric layer, etching the first semiconductor material to create voids filled with inner spacers, removing the dummy gate and the dielectric layer such that a supporting dielectric section remains between the at least two nanosheet structures, and removing the etched first semiconductor material such that a supporting structure is defined including the supporting dielectric section and the second semiconductor material.

In accordance with another embodiment, a method is provided for reducing sagging effects in nanosheet devices. The method includes forming at least two nanosheet structures over a substrate, wherein each nanosheet structure includes alternating layers of a first semiconductor material and a second semiconductor material, forming a supporting dielectric section in a pinch-off region of the at least two nanosheet structures, and removing etched first semiconductor material from the at least two nano sheet structures such that a supporting structure is defined including the supporting dielectric section and the second semiconductor material.

In accordance with yet another embodiment, a semiconductor device for reducing sagging effects in nanosheet devices is provided. The semiconductor device includes a long channel nanosheet device and a supporting dielectric section disposed in a pinch-off region of the long channel nanosheet device such that a supporting structure is defined including the supporting dielectric section and alternating semiconductor material layers of the long channel nanosheet device.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for reducing a sagging effect in long channel devices to optimize long channel device behavior. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage applications.

Long channel nanosheet devices can experience nanosheet bending issues after silicon germanium (SiGe) release. Embodiments in accordance with the present invention alleviate such bending issue or sagging effect by providing exemplary methods and devices for employing a fishbone structure including a supporting material that greatly reduces the sagging effect for the long channel device. Thus, the remaining alternating semiconductor material layers are stabilized or secured to maintain or preserve or uphold their shape such that no or minimally negligent bending or sagging effects are present along a length of the alternating semiconductor layers. Thus, the semiconductor layers remain firm or stiff along their entire length.

Examples of semiconductor materials that can be used in forming such nanosheet structures include silicon (Si), germanium (Ge), silicon germanium alloys (SiGe), carbon doped silicon (Si:C), carbon doped silicon germanium (SiGe:C), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
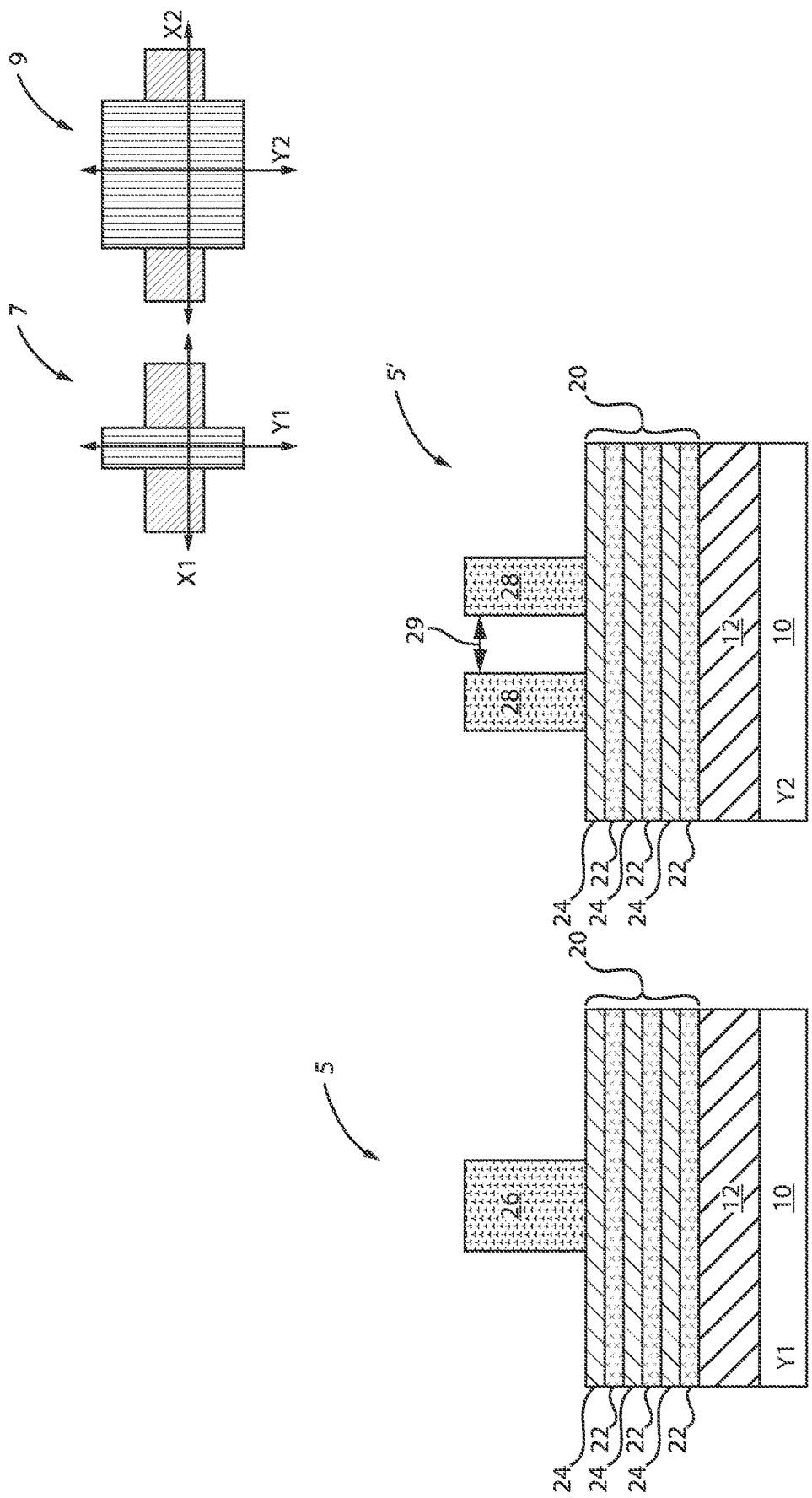
FIG. 1 is a cross-sectional view of a nanosheet structure after extreme ultraviolet (EUV) patterning, in accordance with an embodiment of the present invention.

FIG. 1 is a cross-sectional view of a nanosheet structure after extreme ultraviolet (EUV) patterning, in accordance with an embodiment of the present invention.

A semiconductor structure 5 includes a semiconductor substrate 10. A buried oxide (BOX) layer 12 is formed over the semiconductor substrate 10. A nanosheet stack 20 can be formed over the BOX layer 12. The nanosheet stack 20 can include, e.g., alternating layers of a first semiconductor material 22 and a second semiconductor material 24. The first semiconductor material 22 can be, e.g., silicon germanium (SiGe) and the second semiconductor material 24 can be, e.g., silicon (Si).

Semiconductor structure 5 is a cross-sectional view along axis Y1 of top view 7.

Semiconductor structure 5' is a cross-sectional view along axis Y2 of top view 9.

A hardmask 26 is deposited over nanosheet structure 20 in structure 5 and hardmasks 28 are deposited over nanosheet structure 20 in structure 5'. In structure 5', a distance between hardmask portions or sections 28 is designated as 29. The direct EUV can print less than 20 nm.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), III-V (e.g., GaAs, InGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

Examples of semiconductor materials that can be used in forming such nanosheet structures 20 include at least silicon (Si), germanium (Ge), silicon germanium alloys (SiGe), carbon doped silicon (Si:C), carbon doped silicon germanium (SiGe:C), III-V compound semiconductors and/or II-VI compound semiconductors.

Other non-limiting examples of semiconductor materials for the first and second semiconductor layers 22, 24 of the nanosheet stack 20 include Si (silicon), strained Si, carbon doped Si:C, Ge (germanium), SiGe:C (carbon doped silicon-germanium), Si alloys, Ge alloys, GaAs (gallium arsenide), InAs (indium arsenide), InP (indium phosphide), InGaAs (Indium gallium arsenide) or any combination thereof.

One skilled in the art can contemplate a number of different semiconductor materials for forming the nanosheet structures 20.

First and second semiconductor layers 22, 24 can be formed over the substrate 10 by for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The capping materials 26, 28 can include any one or more of SiN, SiCN, SiBN and/or SiBCN, among other materials. In a preferred embodiment, the hardmask layers 26, 28 can be silicon nitride (SiN), for example, $Si_3N_4$.

In one or more embodiments, the hardmask layers 26, 28 can have a thickness in the range of about 10 nm to about 100 nm, or in the range of about 35 nm to about 75 nm, or in the range of about 45 nm to about 55 nm, although other thicknesses are contemplated.

Figure 2:
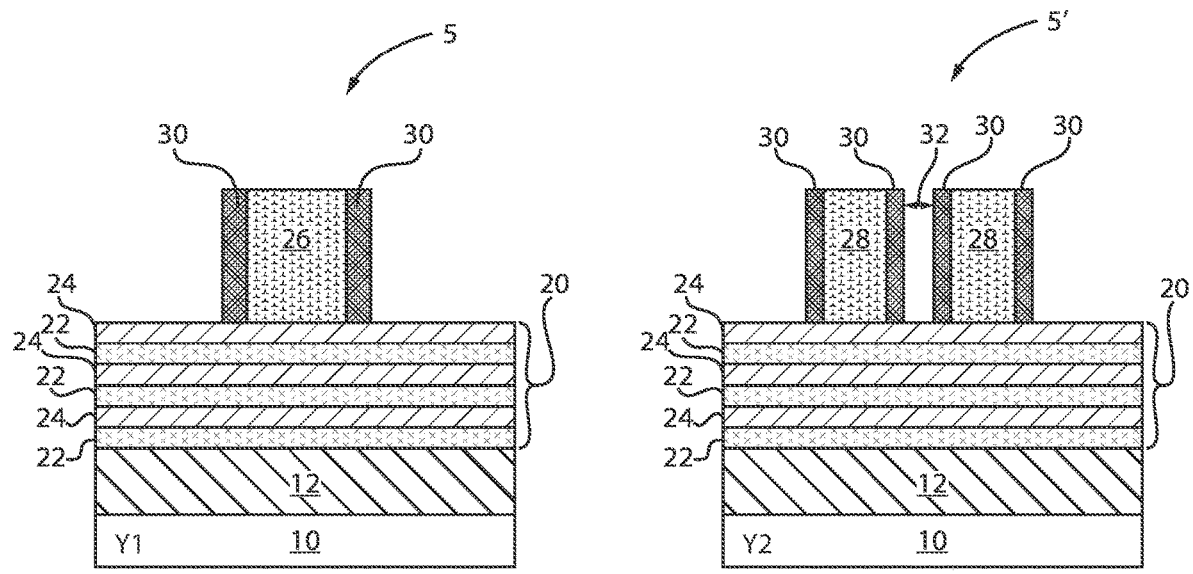
FIG. 2 is a cross-sectional view of the semiconductor structure of FIG. 1 where spacers are formed adjacent hardmasks deposited over the nanosheet structures, in accordance with an embodiment of the present invention.

FIG. 2 is a cross-sectional view of the semiconductor structure of FIG. 1 where spacers are formed adjacent hardmasks deposited over the nanosheet structures, in accordance with an embodiment of the present invention.

In various example embodiments, spacers 30 are formed adjacent hardmasks 26, 28. In structure 5', a distance between spacers 30 is designated as 32. Thus, after spacer formation, the critical dimension (CD) can shrink to less than 10 nm.

The spacers 30 can be, for example, silicon dioxide, silicon nitride, SiOCN, or SiBCN. Other non-limiting examples of materials for the spacers 30 include dielectric oxides (e.g., silicon oxide), dielectric nitrides (e.g., silicon nitride), dielectric oxynitrides, or any combination thereof. The spacer material can be deposited by a deposition process, for example, chemical vapor deposition (CVD) or physical vapor deposition (PVD).

Figure 3:
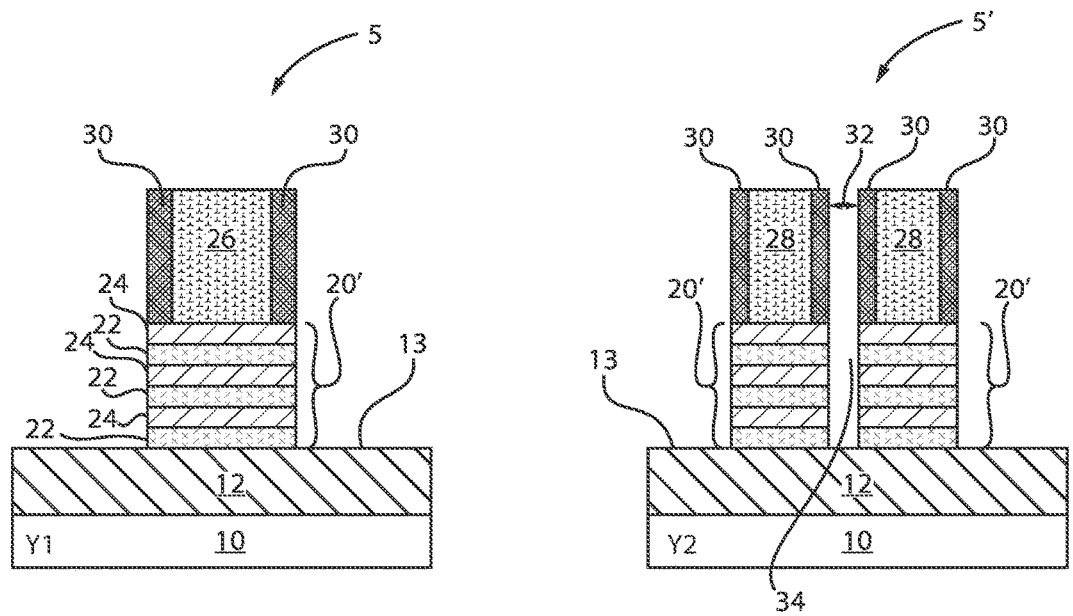
FIG. 3 is a cross-sectional view of the semiconductor structure of FIG. 2 where the nanosheet structures are patterned, in accordance with an embodiment of the present invention.

FIG. 3 is a cross-sectional view of the semiconductor structure of FIG. 2 where the nanosheet structures are patterned, in accordance with an embodiment of the present invention.

In various example embodiments, the nanosheet structure 20 is patterned. A dry etch process, for example, a reactive ion etch (RIE) process, is performed to trim the sidewalls of the nanosheet stack 20. A top surface 13 of the BOX layer 12 is thus exposed. The resulting trimmed nanosheet stack is designated as 20'. A gap 34 is also present between the nanosheet stacks 20' in structure 5'. The gap 34 extends to a top surface 13 of the BOX layer 12.

Figure 4:
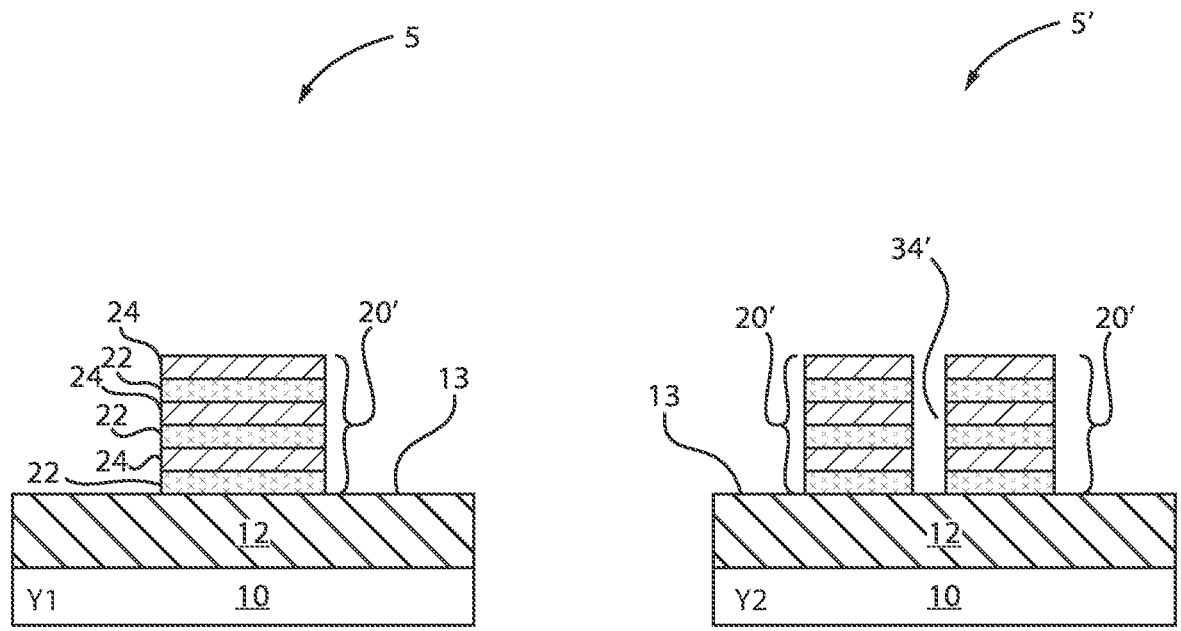
FIG. 4 is a cross-sectional view of the semiconductor structure of FIG. 3 where the hardmasks are removed, in accordance with an embodiment of the present invention.

FIG. 4 is a cross-sectional view of the semiconductor structure of FIG. 3 where the hardmasks are removed, in accordance with an embodiment of the present invention.

In various example embodiments, the hardmask 26, 28 are removed. The removal of the hardmasks 26, 28 results in the full exposure of nanosheet stacks 20'. Additionally, a gap 34' remains between the nanosheet stacks 20' in structure 5'.

Figure 5:
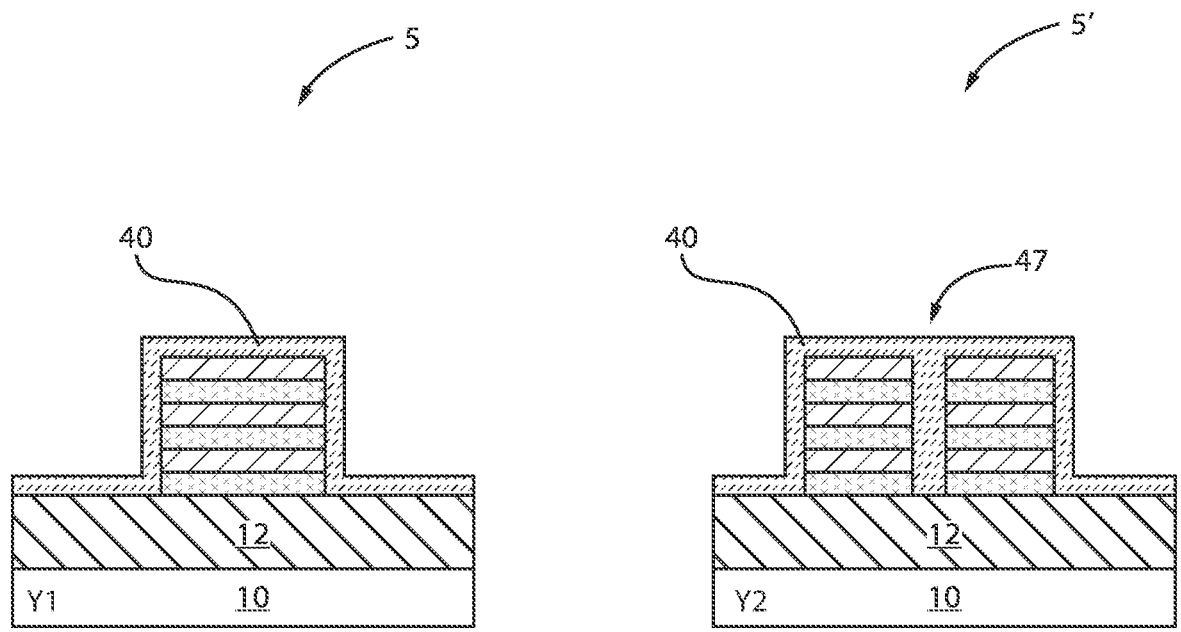
FIG. 5 is a cross-sectional view of the semiconductor structure of FIG. 4 where a dielectric layer is deposited over the nanosheet structures, in accordance with an embodiment of the present invention.

FIG. 5 is a cross-sectional view of the semiconductor structure of FIG. 4 where a dielectric layer is deposited over the nanosheet structures, in accordance with an embodiment of the present invention.

In various example embodiments, a dielectric layer 40 is deposited over the nanosheet stacks 20'. In structure 5', the dielectric layer 40 will extend into a pinch off region 47 defined between the nanosheet stacks 20'.

The dielectric layer 40 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

One example of a material suitable for the low-k materials for the low-k dielectric layer 40 can include silicon oxycarbonitride (SiOCN). Other low-k materials that can also be used for the low-k material layer 40 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 40 can be conformally deposited using chemical vapor deposition (CVD). Variations of CVD processes suitable for forming the dielectric layer 40 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 6:
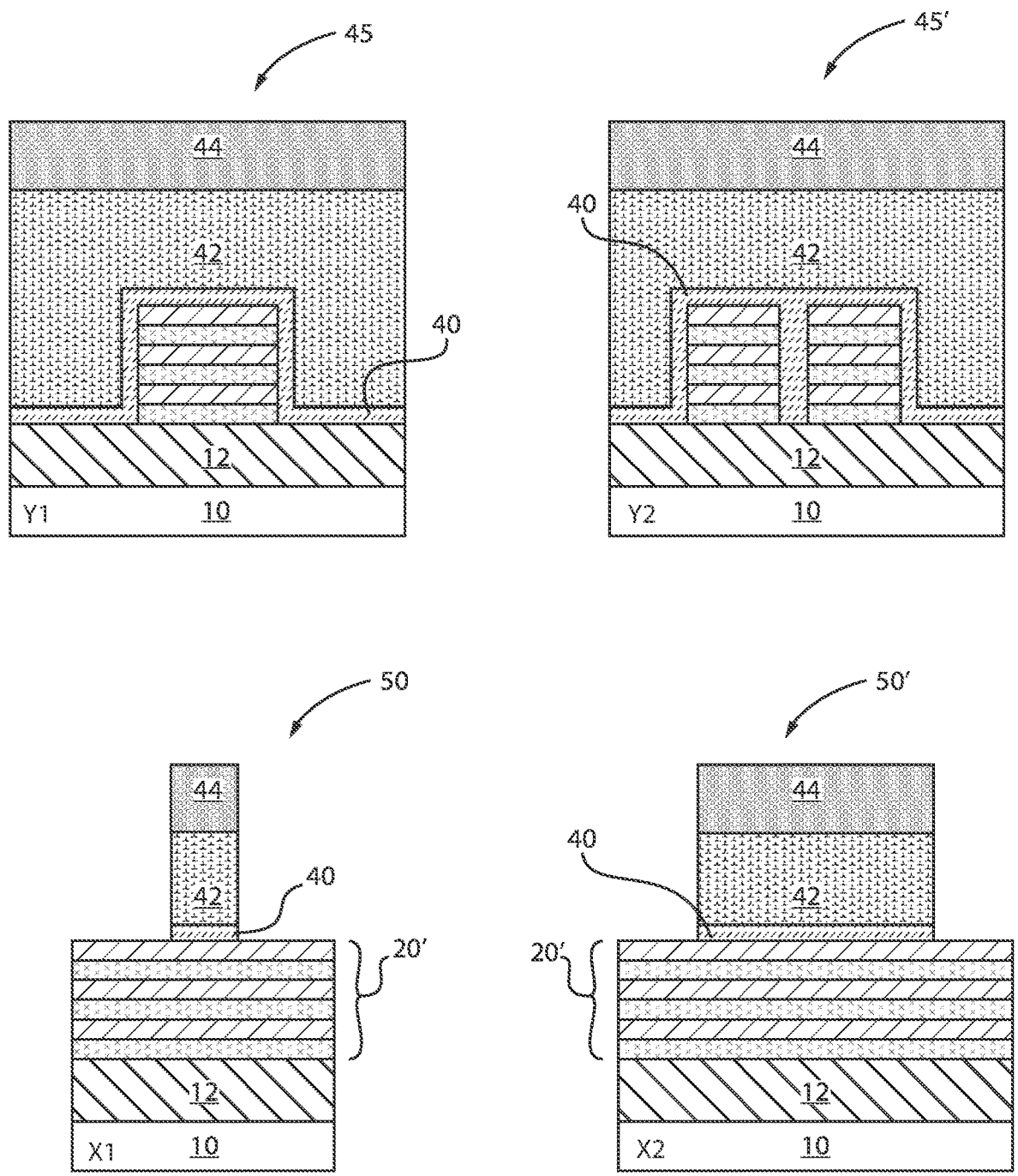
FIG. 6 is a cross-sectional view of the semiconductor structure of FIG. 5 where a dummy gate and sacrificial cap are deposited, in accordance with an embodiment of the present invention.

FIG. 6 is a cross-sectional view of the semiconductor structure of FIG. 5 where a dummy gate and sacrificial cap are deposited, in accordance with an embodiment of the present invention.

In various example embodiments, a dummy gate 42 and a hardmask 44 are deposited over the nanosheet stacks 20'. The dummy gate 42 can be formed over the nanosheet stacks 20', whereas the hardmask 44 can be formed over the dummy gate 42.

Structure 45 is a cross-sectional view along axis Y1 of top view 7.

Structure 45' is a cross-sectional view along axis Y2 of top view 9.

Structure 50 is a cross-sectional view along axis X1 of top view 7.

Structure 50' is a cross-sectional view along axis X2 of top view 9.

Dummy gate 42 materials include, but are not limited to, any one or more of amorphous or polycrystalline Si, SiO$_2$, SiON, SiGe, Ge, GeO$_2$, amorphous C, BC, CN, etc.

In various example embodiments, the hardmask layer 44 can be a nitride, for example, a silicon nitride (SiN), an oxynitride, for example, silicon oxynitride (SiON), or a combination thereof.

The dummy gate 42 can be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Figure 7:
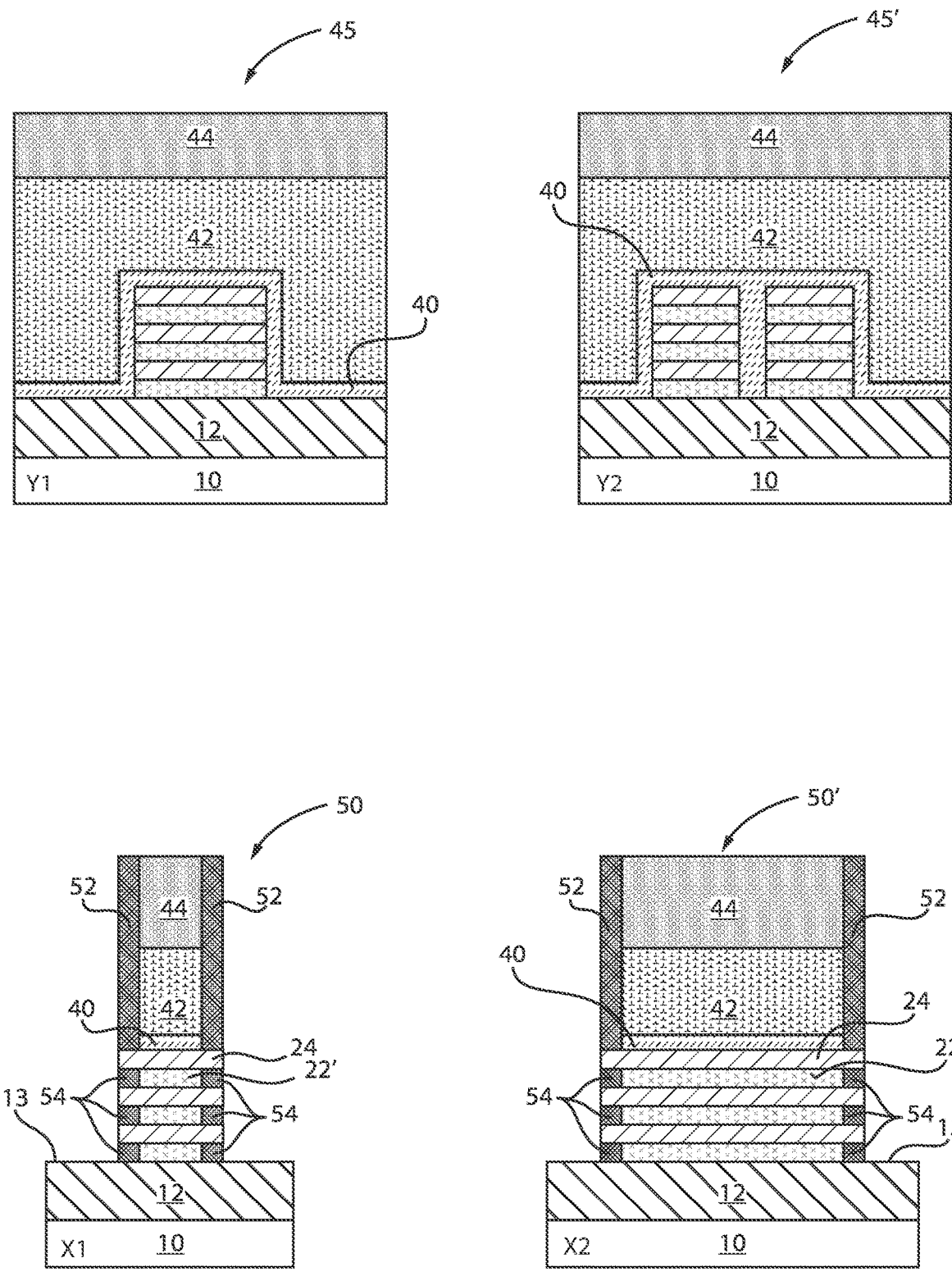
FIG. 7 is a cross-sectional view of the semiconductor structure of FIG. 6 where inner spacers and outer spacers are formed, in accordance with an embodiment of the present invention.

FIG. 7 is a cross-sectional view of the semiconductor structure of FIG. 6 where inner spacers and outer spacers are formed, in accordance with an embodiment of the present invention.

In various example embodiments, the first semiconductor material 22 of the nanosheet stack 20' can be etched such that inner spacers 54 are formed adjacent the etched material 22', as illustrated in structures 50, 50'. Additionally outer spacers 52 can be formed adjacent the dummy gate 42 and the hardmask 44. The inner spacers 54 are vertically aligned with the outer spacers 52.

A wet etch process can be performed to form the lateral recesses (voids) in the semiconductor layer 22 of the nanosheet stack 20'. The wet etch process selectively removes portions of the first semiconductor layer 22 and depends on the materials forming the first and second semiconductor layers 22, 24. The wet etch process can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

The semiconductor layer 22 that is removed can be the SiGe material. In some embodiments, the selective removal of the SiGe layers 22 is performed by hydrochloride gas at a temperature ranging from about 500° C. to about 800° C. As a result, the Si material layer 24 of the nanosheet stack 20' remains intact.

The inner spacer material 54 fills the gaps between the second semiconductor layers 24. The inner spacer material 54 directly contacts the BOX layer 12 and alternates with the first semiconductor layer 22'.

The inner spacer material 54 can be a dielectric material, for example, a low-k dielectric material having a k of less than 5. The inner spacer material 54 can be deposited in the lateral recesses by performing a deposition process, for example, ALD, PVD, CVD, or other like processes. The inner spacer material 54 can include, but is not limited to, silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, silicon borocarbonitride (SiBCN) or any combination thereof.

In one example, the inner spacers 54 and the outer spacers 52 can be composed of any one or more of SiN, SiBN, SiCN and/or SiBCN films.

Figure 8:
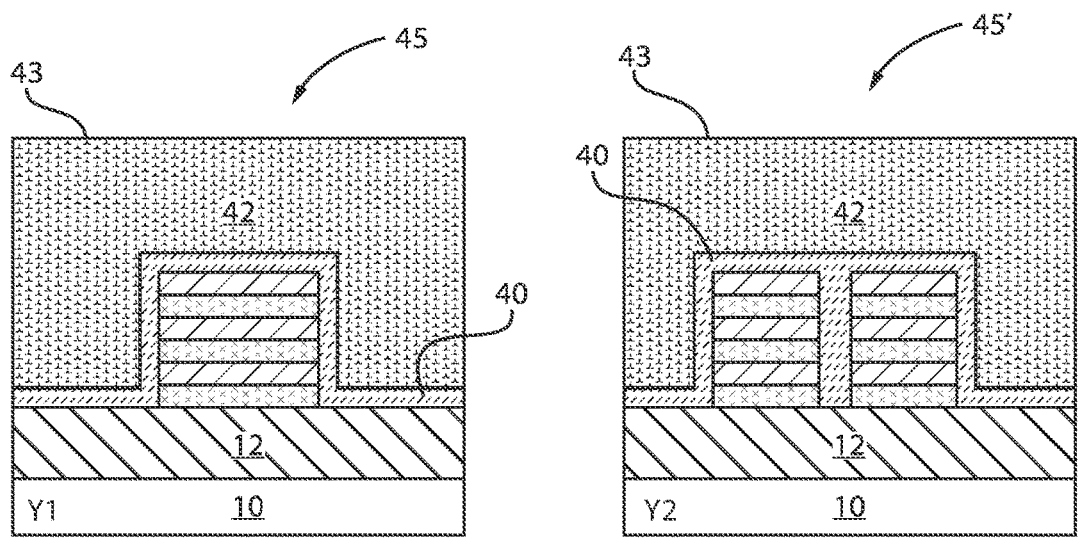
FIG. 8 is a cross-sectional view of the semiconductor structure of FIG. 7 where source/drain epi regions are formed and an interlayer dielectric (ILD) is deposited, in accordance with an embodiment of the present invention.
Figure 8:
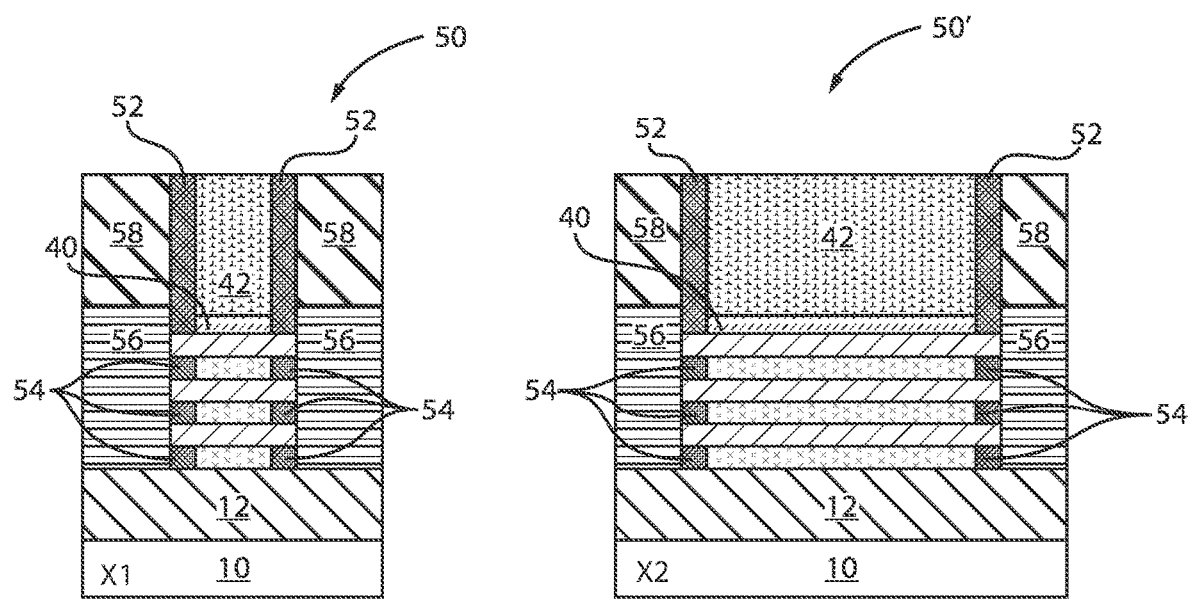

FIG. 8 is a cross-sectional view of the semiconductor structure of FIG. 7 where source/drain epi regions are formed and an interlayer dielectric (ILD) is deposited, in accordance with an embodiment of the present invention.

In various example embodiments, source/drain (S/D) regions 56 can be formed by performing an epitaxial growth process to form epitaxial growth on the exposed surfaces of nanosheet stack 20' and on the BOX layer 12. The S/D regions 56 can directly contact sidewalls of all the inner spacers 54. The S/D regions 56 can directly contact lower sidewalls of the outer spacers 52. The S/D regions 56 further directly contact the sidewalls of all of the second semiconductor material 24 of the nanosheet stacks 20'.

The epitaxial growth forming the source/drain 56 can be formed using a growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

An ILD 58 can then be formed over the S/D regions 56. The ILD 58 directly contacts the sidewalls of the outer spacers 52. The ILD 58 can be planarized by, e.g., chemical mechanical planarization (CMP).

The ILD 58 can be any suitable dielectric such as, for example, silicon oxide (SiO), silicon nitride (SiN), silicon oxynitride (SiON), silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 58 can be a low-k oxide.

Additionally, the hardmask 44 is removed to expose a top surface 43 of the dummy gate 42.

Figure 9:
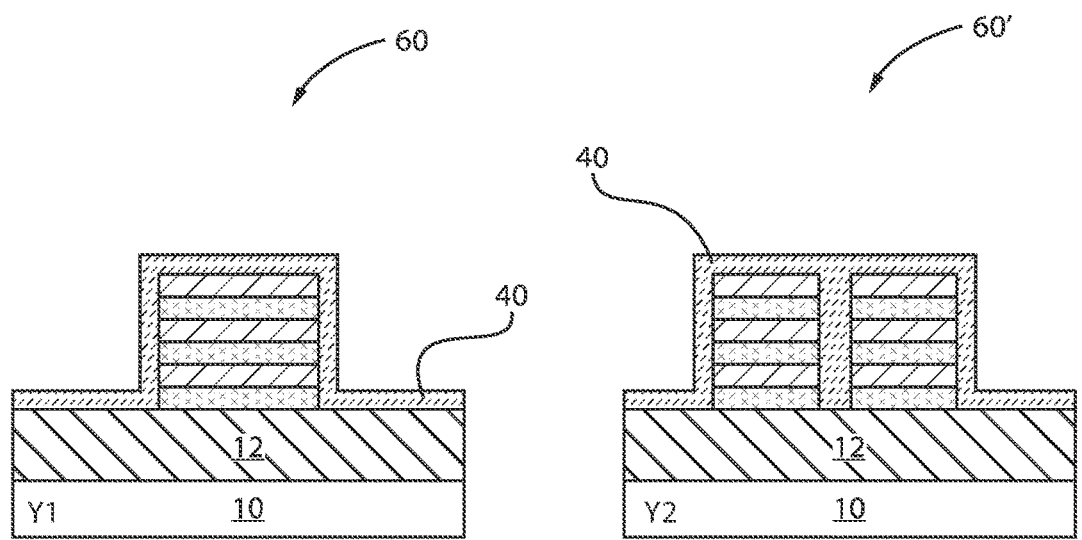
FIG. 9 is a cross-sectional view of the semiconductor structure of FIG. 8 where the dummy gate is removed, in accordance with an embodiment of the present invention.
Figure 9:
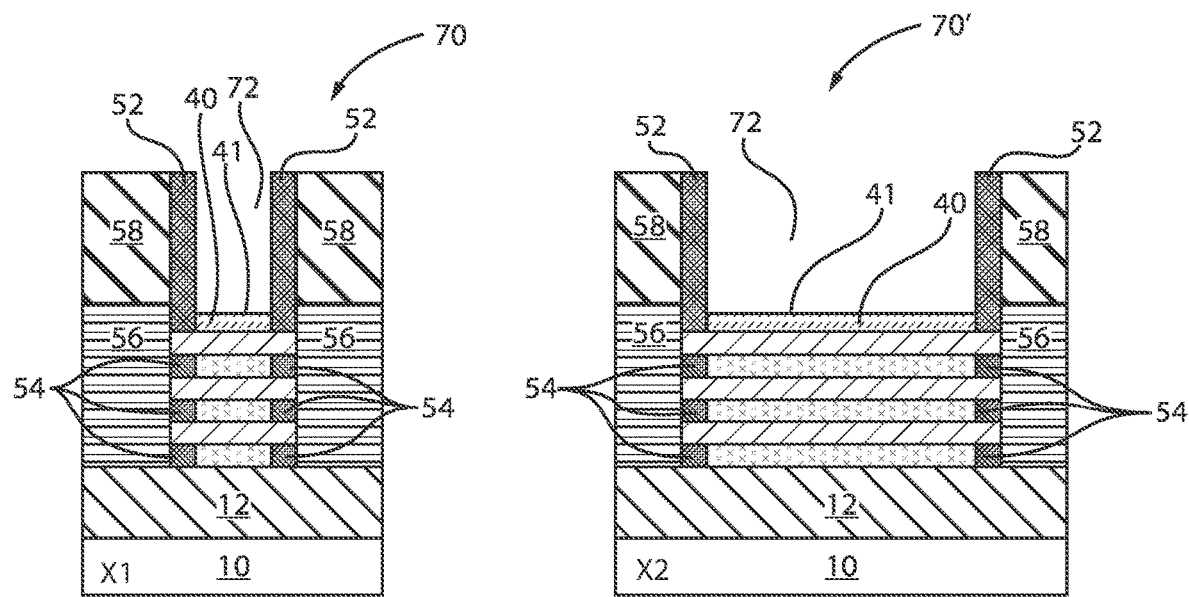

FIG. 9 is a cross-sectional view of the semiconductor structure of FIG. 8 where the dummy gate is removed, in accordance with an embodiment of the present invention.

In various example embodiments, the dummy gate 42 can be removed by implementing an RIE process and/or a wet etching process. If the dummy gate 42 is made of amorphous or poly-Si, it can be etched in hot NH$_4$OH or Tetramethylammonium hydroxide (TMAH) chemistries in a manner that is selective to the dielectric layer 40.

The removal of the dummy gate 42 results in the structure 60 (along axis Y1; FIG. 1) and structure 60' (along axis Y2; FIG. 1), where the dielectric layer 40 is fully exposed. Moreover, the removal of the dummy gate 42 results in the structure 70 (along axis X1; FIG. 1) and structure 70' (along axis X2; FIG. 1), where a top surface 41 of the dielectric layer 40 is exposed, and openings 72 are defined between the outer spacers 52.

Figure 10:
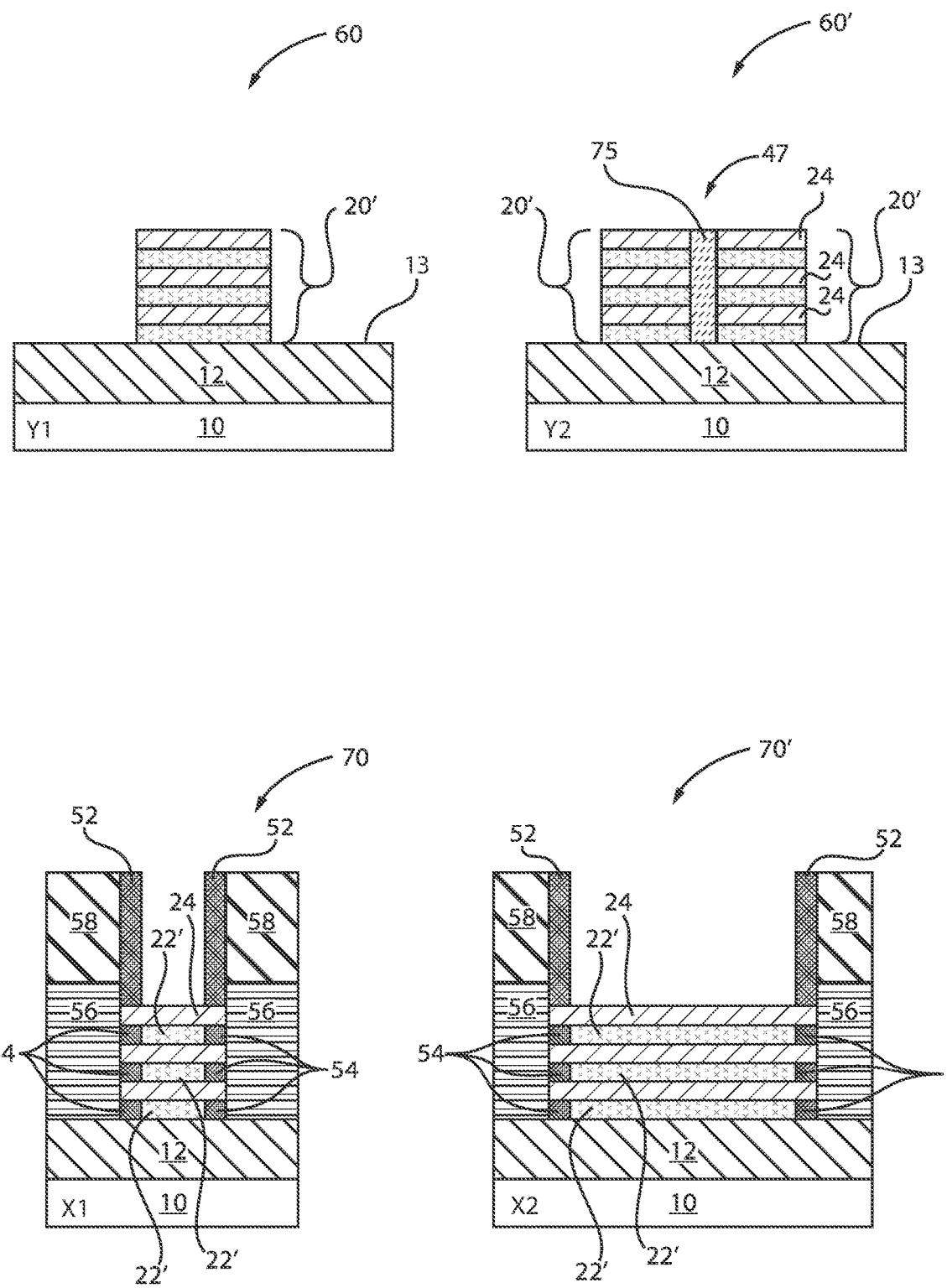
FIG. 10 is a cross-sectional view of the semiconductor structure of FIG. 9 where the dielectric layer is removed such that a dielectric section remains in a pinch-off region, in accordance with an embodiment of the present invention.

FIG. 10 is a cross-sectional view of the semiconductor structure of FIG. 9 where the dielectric layer is removed such that a dielectric section remains in a pinch-off region, in accordance with an embodiment of the present invention.

In various example embodiments, the dielectric layer 40 is removed such that a dielectric section 75 remains in a pinch-off region 47. The dielectric section 75 can extend to a top surface of the nanosheet stacks 20'. The dielectric section 75 helps support the nanosheet structure from bending in the long channel. Stated differently, the dielectric section 75 helps stabilize or secure the semiconductor layers 24 to maintain or preserve or uphold their shape such that no or minimally negligent bending or sagging effects are present along a length of the semiconductor layers 24. Thus, the semiconductor layers 24 remain firm or stiff across or along their entire length.

Figure 11:
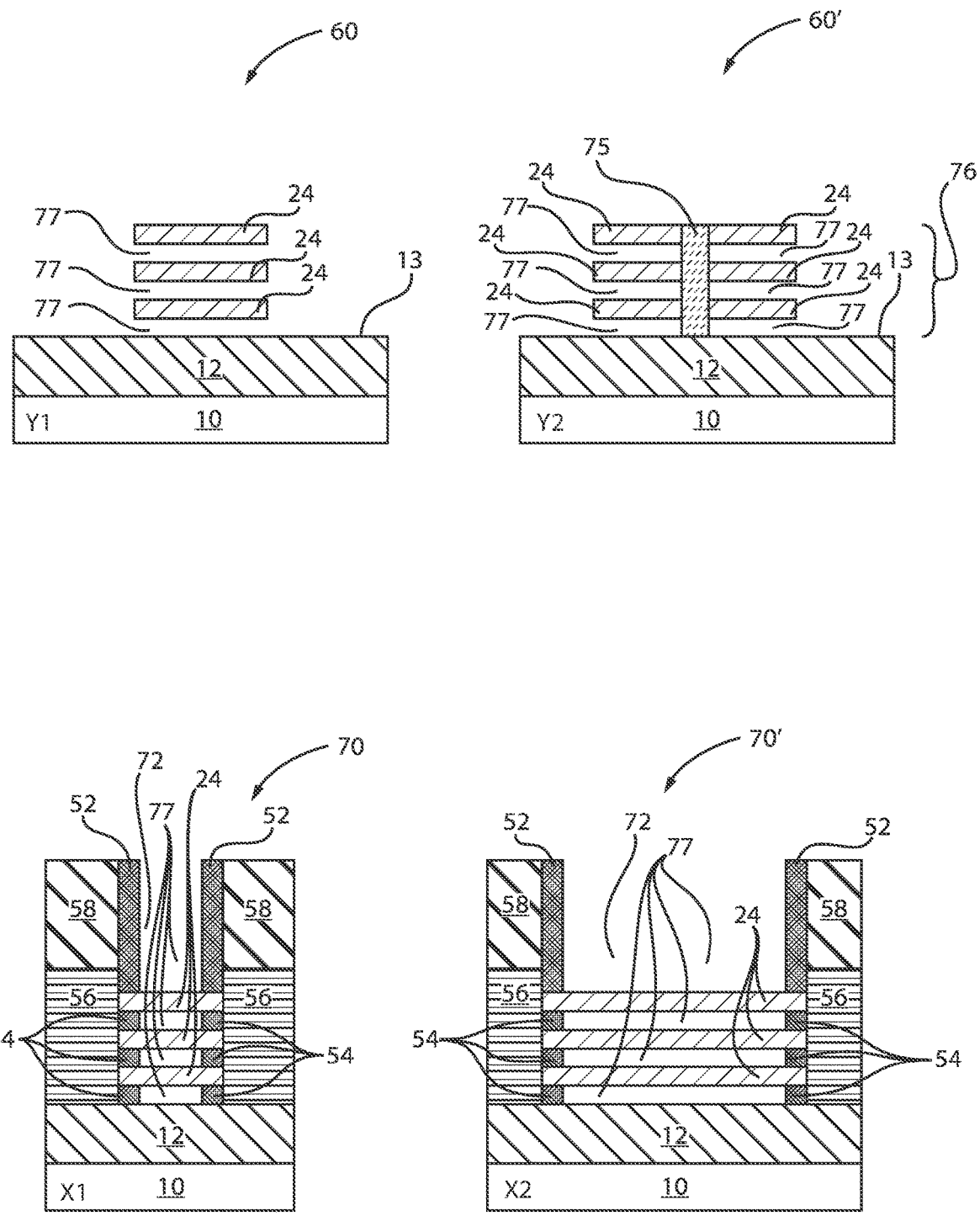
FIG. 11 is a cross-sectional view of the semiconductor structure of FIG. 10 where an alternating layer of semiconductor material is removed from the nanosheet structure resulting in openings, in accordance with an embodiment of the present invention.

FIG. 11 is a cross-sectional view of the semiconductor structure of FIG. 10 where an alternating layer of semiconductor material is removed from the nanosheet structure resulting in openings, in accordance with an embodiment of the present invention.

In various example embodiments, an alternating layer of semiconductor material 22' is removed from the nanosheet stacks 20' resulting in openings 77. The remaining structure 76 can be referred to as a fishbone structure or supporting structure. The fishbone structure 76 includes the dielectric section 75, as well as the layers of the second semiconductor material 24 (e.g., Si layers). The dielectric section 75 helps support the nanosheet structure from bending in the long channel.

Structures 70, 70' further illustrate openings 72 where the dummy gate 42 was previously removed. Openings 77 are defined between the second semiconductor layers 24.

Figure 12:
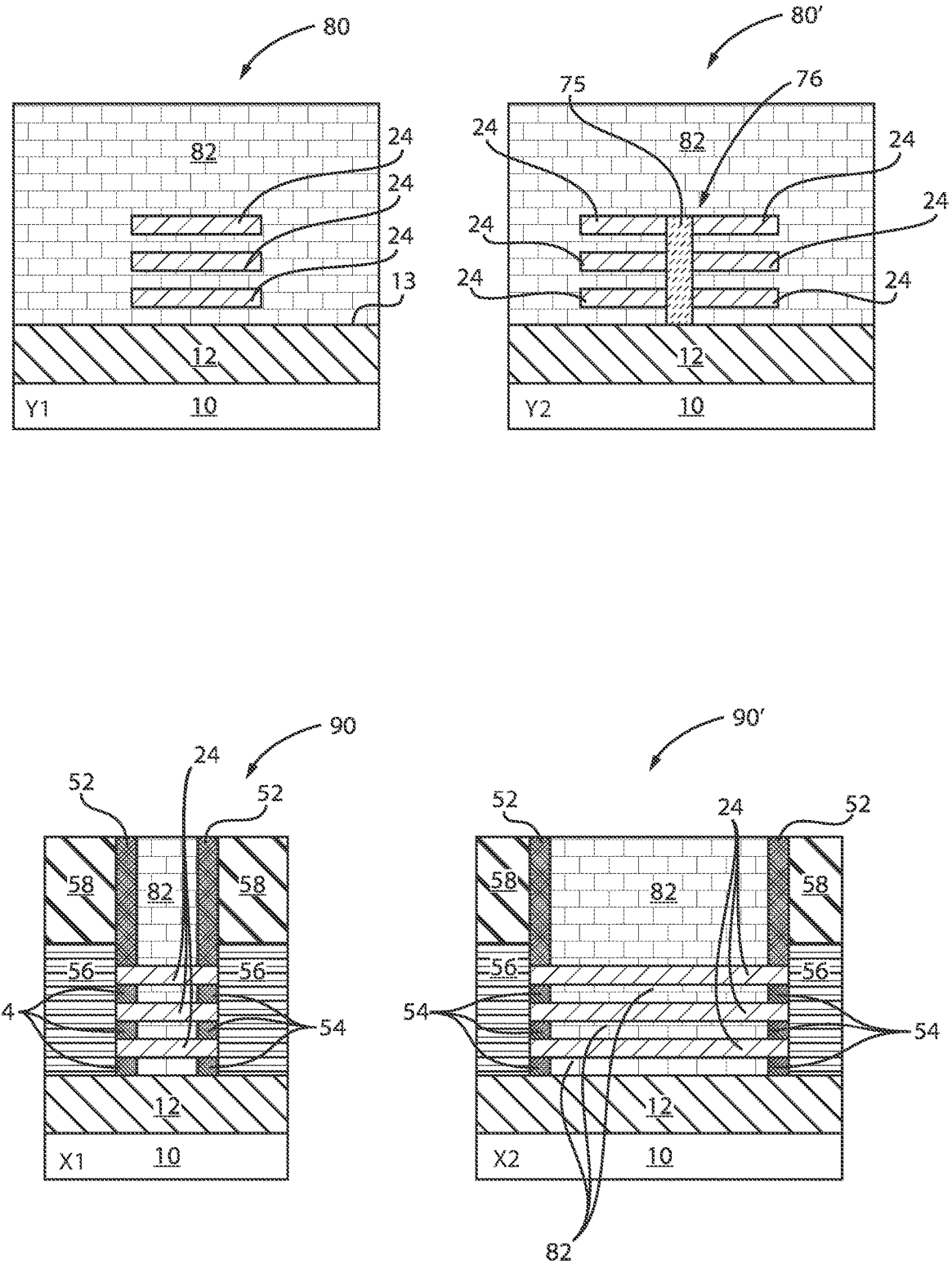
FIG. 12 is a cross-sectional view of the semiconductor structure of FIG. 11 where a high-k metal gate is formed within the openings, in accordance with an embodiment of the present invention.

FIG. 12 is a cross-sectional view of the semiconductor structure of FIG. 11 where a high-k metal gate is formed within the openings, in accordance with an embodiment of the present invention.

In various example embodiments, high-k metal gate 82 is deposited. The high-k metal gate can be referred to as a replacement gate.

Replacement gates 82 are formed in regions or openings 72, 77 of the device structure previously occupied by the dummy gates 42 and the SiGe material 22. In one example, a high-k material and a work function metal can be deposited. The high-k material can be any of the materials HfO$_x$, HfSiO$_x$, Al$_2$O$_3$, ZrO$_2$, ZrSiO$_x$, among other materials. The work function material can include any of the following metal compounds TiN, TaN, TiC, TaC, La$_2$O$_3$, Al, AlO$_x$, among other materials. Both high-k and work function metals can be deposited by PVD, CVD or ALD processes. The high-k metal gate 82 can be planarized by, e.g., chemical mechanical planarization (CMP).

The deposition of the high metal gate 82 results in the structure 80 (along axis Y1; FIG. 1) and structure 80' (along axis Y2; FIG. 1). Moreover, the deposition of the high metal gate 82 results in the structure 90 (along axis X1; FIG. 1) and structure 90' (along axis X2; FIG. 1). The fishbone structure 76 is illustrated in structure 80' where is appears surrounded or encompassed by the high-k metal gate 82. The dielectric section 75 helps support the nanosheet structure from bending in the long channel.

In summary, the device structure of the exemplary embodiments of the present invention includes at least one nFET transistor and at least one pFET transistor, where in the Y-cut, there is supporting material to hold the nanosheet stack. The "fishbone" dielectric material is in the middle or central portion of sheet stack for the long channel device. In the x-cut, the sagging effect is thus greatly improved.

The method of the exemplary embodiments of the present invention includes at least two nanosheet widths in patterning, using EUV minimum print spacing as the supporting pillar in the downstream process, and employing the pinch-off concept to back fill the openings with the dielectric material.

Therefore, the methods and structures of the exemplary embodiments form a supporting dielectric layer in a central or middle region of the nanosheet long channel device to prevent bending or channel collapse or the sagging effect to optimize long channel device behavior. Thus, the methods and structures of the exemplary embodiments present a supporting structure in between nanosheet stacks, in the active device region, to support the long channel device from sagging by stabilizing or securing alternating layers of a semiconductor material in a firm, non-bending state.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a fishbone long channel nanosheet device (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for reducing sagging effects in nanosheet devices, the method comprising:
   forming at least two nanosheet structures over a substrate, wherein each nanosheet structure includes alternating layers of a first semiconductor material and a second semiconductor material;
   depositing a dielectric layer over the at least two nanosheet structures;
   depositing a dummy gate over the dielectric layer;
   etching the first semiconductor material to create voids filled with inner spacers;
   removing the dummy gate and the dielectric layer such that a supporting dielectric section remains between the at least two nanosheet structures;
   removing the etched first semiconductor material such that a supporting structure is defined including the supporting dielectric section and the second semiconductor material; and
   depositing a high-k metal gate directly contacting vertical sidewalls of the second semiconductor material of the supporting structure.

2. The method of claim 1, wherein the supporting structure defines a substantially fishbone configuration.

3. The method of claim 1, wherein outer spacers are formed adjacent the dummy gate.

4. The method of claim 3, wherein the inner spacers and the outer spacers are vertically aligned.

5. The method of claim 1, wherein source/drain regions are formed adjacent the at least two nanosheet structures with the etched first semiconductor material.

6. The method of claim 1, wherein the supporting structure is formed in between the at least two nanosheet structures.

7. The method of claim 1, wherein the supporting dielectric section stabilizes the second semiconductor material to prevent sagging along a length thereof.

8. A method for reducing sagging effects in nanosheet devices, the method comprising:
   forming at least two nanosheet structures over a substrate, wherein each nanosheet structure includes alternating layers of a first semiconductor material and a second semiconductor material;
   forming a supporting dielectric section in a pinch-off region of the at least two nanosheet structures;
   removing etched first semiconductor material from the at least two nanosheet structures such that a supporting structure is defined including the supporting dielectric section and the second semiconductor material; and
   depositing a high-k metal gate directly contacting vertical sidewalls of the second semiconductor material of the supporting structure.

9. The method of claim 8, wherein the supporting structure defines a substantially fishbone configuration.

10. The method of claim 8, wherein a dummy gate is deposited over a dielectric layer before etching the first semiconductor material.

11. The method of claim 8, wherein inner spacers are disposed adjacent the etched first semiconductor material.

12. The method of claim 11, wherein outer spacers are formed adjacent the dummy gate.

13. The method of claim 12, wherein the inner spacers and the outer spacers are vertically aligned.

14. The method of claim 8, wherein source/drain regions are formed adjacent the at least two nanosheet structures with the etched first semiconductor material.

15. The method of claim 8, wherein the supporting structure is formed in between the at least two nanosheet structures.

16. The method of claim 8, wherein the supporting dielectric section stabilizes the second semiconductor material to prevent sagging along a length thereof.

17. A semiconductor structure for reducing sagging effects in nanosheet devices, the semiconductor structure comprising:
   a long channel nanosheet device;
   a supporting dielectric section disposed in a pinch-off region of the long channel nanosheet device such that a supporting structure is defined including the supporting dielectric section and alternating layers of a semiconductor material of the long channel nanosheet device; and
   a high-k metal gate directly contacting vertical sidewalls of the semiconductor material of the supporting structure.

18. The semiconductor structure of claim 17, wherein the supporting structure defines a substantially fishbone configuration.

19. The semiconductor structure of claim 17, wherein the supporting dielectric section stabilizes the alternating layers of the semiconductor material to prevent sagging along a length of the alternating layers of the semiconductor material.

20. The semiconductor structure of claim 17, wherein the supporting structure is formed in between nanosheet structures of the nanosheet device.

* * * * *